(12) United States Patent
Sun (10) Patent No.: US 10,216,056 B2
(45) Date of Patent: Feb. 26, 2019

(54) ARRAY SUBSTRATE, LIQUID CRYSTAL DISPLAY PANEL, AND LIQUID CRYSTAL DISPLAY DEVICE

(71) Applicant: Wuhan China Star Optoelectronics Technology Co., Ltd., Wuhan, Hubei (CN)

(72) Inventor: Yanyang Sun, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 70 days.

(21) Appl. No.: 15/522,655

(22) PCT Filed: Mar. 9, 2017

(86) PCT No.: PCT/CN2017/076084
§ 371 (c)(1),
(2) Date: May 9, 2017

(87) PCT Pub. No.: WO2018/152872
PCT Pub. Date: Aug. 30, 2018

(65) Prior Publication Data
US 2018/0275456 A1    Sep. 27, 2018

(30) Foreign Application Priority Data
Feb. 22, 2017 (CN) .......................... 2017 1 0095154

(51) Int. Cl.
*G02F 1/1362* (2006.01)
*H01L 27/12* (2006.01)
*G02F 1/1335* (2006.01)

(52) U.S. Cl.
CPC .... *G02F 1/136286* (2013.01); *G02F 1/13624* (2013.01); *G02F 1/133514* (2013.01); *G02F 1/136259* (2013.01); *H01L 27/124* (2013.01); *H01L 27/1244* (2013.01); *G02F 2201/123* (2013.01)

(58) Field of Classification Search
CPC .......................... G02F 1/136286; H01L 27/124
See application file for complete search history.

(56) References Cited

U.S. PATENT DOCUMENTS

| | | | | |
|---|---|---|---|---|
| 2004/0021816 | A1* | 2/2004 | Jeong | G02F 1/133553 349/117 |
| 2004/0046901 | A1* | 3/2004 | Matsuoka | G02F 1/133707 349/43 |
| 2007/0109482 | A1* | 5/2007 | Kim | G02F 1/133707 349/144 |
| 2010/0277447 | A1* | 11/2010 | Itoh | G02F 1/136209 345/205 |

(Continued)

*Primary Examiner* — Jia X Pan (57) ABSTRACT

Disclosed are an array substrate, a liquid crystal display panel, and a liquid crystal display device. The array substrate includes a plurality of data lines and a plurality of pixel units. Each data line is divided into multiple continuously connected data line segments, and each pixel unit has a pixel switch. Each data line segment is divided into a first section and a second section which are connected to each other end to end, the second section being located in a region of a pixel switch corresponding to the data line segment to which the second section belongs, the shape of the second section being in a shape of a curve.

6 Claims, 5 Drawing Sheets

(56) References Cited

U.S. PATENT DOCUMENTS

| | | | |
|---|---|---|---|
| 2016/0147122 A1* | 5/2016 | Hwang | G02F 1/133512 257/72 |
| 2016/0202543 A1* | 7/2016 | Park | G02F 1/13394 349/42 |
| 2017/0082899 A1* | 3/2017 | Joten | G02F 1/1339 |
| 2017/0153482 A1* | 6/2017 | Miyamoto | G02F 1/136286 |

* cited by examiner

Fig. 1

(Prior art)

ARRAY SUBSTRATE, LIQUID CRYSTAL DISPLAY PANEL, AND LIQUID CRYSTAL DISPLAY DEVICE

CROSS-REFERENCE TO RELATED APPLICATIONS

This application claims the priority of Chinese patent application CN201710095154.7, entitled "Array substrate, liquid crystal display panel, and liquid crystal display device" and filed on Feb. 22, 2017, the entirety of which is incorporated herein by reference.

FIELD OF THE INVENTION

The present disclosure relates to the technical field of display, and in particular, to an array substrate, a liquid crystal display panel, and a liquid crystal display device.

BACKGROUND OF THE INVENTION

During an entire process of forming an array substrate, in order to ensure that a result of each procedure of the process is within a range of control and avoid occurrence of massive defective products in a product line, a corresponding engineering inspection is conducted generally after a procedure is completed. During the engineering inspection, respective procedures and a finished product are inspected to see whether or not there is any defection, and to determine whether an array repair is needed or not according to the inspection results.

Figure 1:
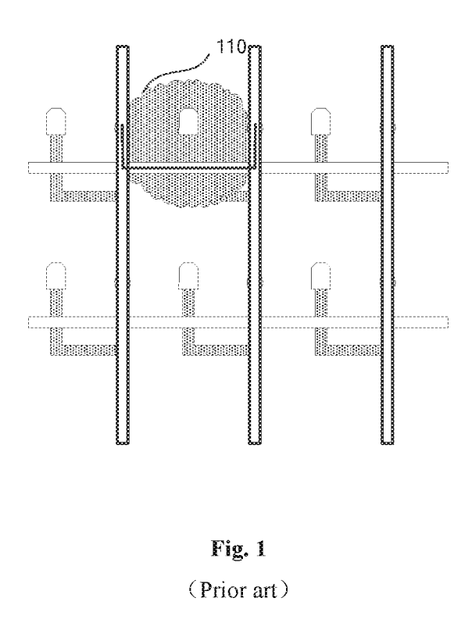
FIG. 1 schematically shows a partial structure of an array substrate in which a data-data short between adjacent data lines is caused by residual Ploy Si in the prior art.

During the array repair process, there is a high frequency of a problem of Ploy Si residue (i.e., 110 shown in FIG. 1) as shown in FIG. 1. Under a circumstance as shown in FIG. 1, since the Ploy Si covered by a gate line cannot be removed by means of a laser device, a data-data short between adjacent data lines will be caused, which causes scrapping of an integrated array substrate and a waste of productivity.

To sum up, there is an urgent need to provide a new array substrate design solution in order to solve the above-mentioned problem.

SUMMARY OF THE INVENTION

With respect to the above-mentioned technical problem, the present disclosure provides an array substrate, a liquid crystal display panel, and a liquid crystal display device. By removing Ploy Si, which connects first sections of two adjacent data line segments, the array substrate is repaired, which is conductive to reducing scrapping of array substrates and reducing production activity loss.

According to a first aspect of the present disclosure, an array substrate is provided. The array substrate comprises a plurality of data lines, each of which is divided into multiple continuously connected data line segments, a plurality of scanning lines, and a plurality of pixel units, each of which includes a pixel switch. Each data line segment corresponds to a pixel switch and a scanning line. Each data line segment is divided into a first section and a second section, the first section and the second section being connected to each other end to end. The second section is located in a region of the pixel switch corresponding to the data line segment to which the second section belongs, and the second section is in a shape of a curve.

According to embodiments of the present disclosure, the second section is in an axisymmetric shape.

According to embodiments of the present disclosure, an axis of symmetry of the shape of the second section is the scanning line corresponding to the data line segment to which the second section belongs.

According to embodiments of the present disclosure, the second section is in a centrosymmetric shape According to embodiments of the present disclosure, a center of symmetry of the shape of the second section is an intersection of the data line segment to which the second section belongs and the scanning line corresponding to the data line segment to which the second section belongs.

According to embodiments of the present disclosure, the second section is in a shape of an arc, a trapezoid, or a triangle.

According to embodiments of the present disclosure, the second section is in an S-shape.

According to embodiments of the present disclosure, the first section is in a linear shape.

According to a second aspect of the present application, a liquid crystal display panel is further provided. The liquid crystal display panel comprises: an array substrate as mentioned above; a color filter substrate; and a liquid crystal layer arranged between the array substrate and the color filter substrate.

According to a third aspect of the present disclosure, a liquid crystal display device is further provided. The liquid crystal display device comprises the liquid crystal display panel as mentioned above.

Compared with the prior art, one or more embodiments of the above solution can have the following advantages or achieve the following beneficial effects.

With regard to a data-data short between adjacent data lines caused by Ploy Si below a scanning line (i.e., a gate line), the present disclosure provides a solution of removing the Ploy Si, which connects first sections of two adjacent data line segments, by configuring the data line in the region of the pixel switch to be in a shape of a curve so as to eliminate the problem of the data-data short between adjacent data lines and further achieve the repairing of the array substrate, reducing scrapping of array substrates, and reducing production capacity loss.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

The accompanying drawings are provided for better understanding the present disclosure, and constitute one part of the description. The accompanying drawings are used for explaining the present disclosure together with the embodiments of the present disclosure, rather than restricting the present disclosure. In the accompanying drawings.

DETAILED DESCRIPTION OF THE EMBODIMENTS

The present disclosure will be explained in detail below with reference to the embodiments and the accompanying drawings, so that one can fully understand how the present disclosure solves the technical problem and achieves the technical effects through technical means, thereby implementing the same. It should be noted that as long as there is no structural conflict, any of the embodiments and any of the technical features thereof may be combined with one another, and the technical solutions obtained therefrom all fall within the scope of the present disclosure.

Embodiment 1

Figure 2:
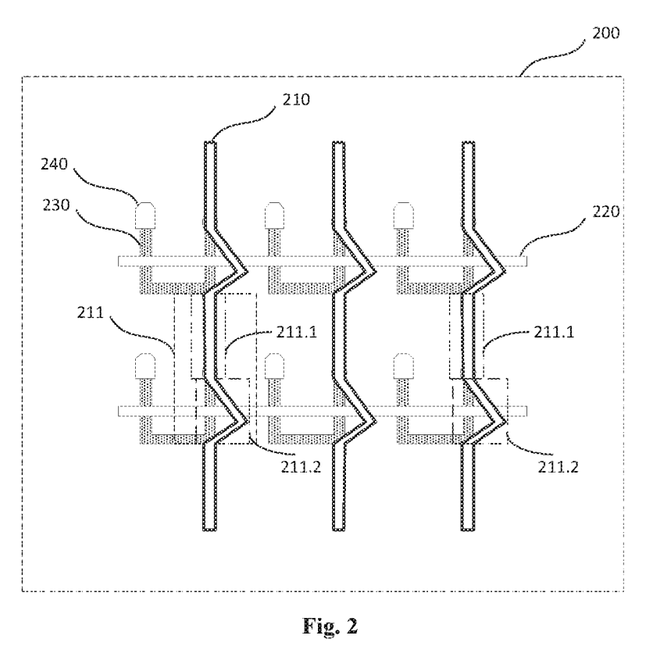
FIG. 2 schematically shows a partial structure of a first array substrate in embodiments of the present disclosure.

In order to solve the problem of an unrepairable data-data short between adjacent data lines caused by Ploy Si provided below a scanning line, an array substrate is provided in the present embodiment. FIG. 2 schematically shows a partial structure of a first array substrate in embodiments of the present disclosure. The specific structure of the array substrate 200 is described in detail below in combination with FIG. 2.

The array substrate 200 comprises a plurality of data lines 210, a plurality of scanning lines 220, a plurality of U-shaped Ploy Sis 230, a plurality of via holes 240, and a plurality of pixel units (which are not shown in FIG. 2). Data lines 210 and scanning lines 220, which are arranged crisscross, divide the entire display area into a plurality of pixel units. Each pixel unit corresponds to a U-shaped Ploy Si 230 and a via hole 240. Specifically, the via hole 240 surrounds an upper end of a left branch of the U-shaped Ploy Si 230 for connecting the U-shaped Ploy Si 230 to a pixel electrode of the pixel unit.

In the present embodiment, each data line 210 is preferably divided into multiple continuously connected data line segments 211. Specifically, each data line 210 is preferably divided into multiple segments with an equal length (each segment is called a data line segment 211), and a data line segment 211 is connected to another data line segment 211 end to end. Besides, each pixel unit comprises a pixel switch, and each data line 210 corresponds to a pixel switch, a scanning line 220, and a U-shaped Ploy Si 230.

In the present embodiment, each data line segment is preferably divided into a first section 211.1 and a second section 211.2, the first section 211.1 and the second section 211.2 being connected end to end. Specifically, a bottom end of the first section 211.1 is connected to a top end of the second section 211.2.

Further, the second section 211.2 is located in a region of the pixel switch corresponding to the data line segment 211 to which the second section 211.2 belongs, and the second section 211.2 is in a shape of a curve. In this way, in a same plane (for example, a plane in which the data line 210 is located, a plane in which the U-shaped Ploy Si 230 is located, or a plane that is parallel to the above mentioned two planes), a projection of the second section 211.2 does not entirely coincide with a projection of a right branch of the U-shaped Ploy Si 230 corresponding to the data line segment 211 to which the second section 211.2 belongs. There are three things to be noted.

First, the pixel switch in the present embodiment refers to a thin film transistor in the pixel unit. Thus, the region of the pixel switch refers to a region where the thin film transistor is located. Specifically, the region where the thin film transistor is located refers to a region where there is only one thin film transistor. Thus, the region of the pixel switch in the present embodiment refers to the region where there is only one thin film transistor.

Second, the feature that the second section 211.2 is in a shape of a curve means that a length of the second section 211.2 is required to be longer than a shortest distance between first sections 211.1 of two adjacent data line segments 211 (under this circumstance, the second section 211.2 is definitely a curve). In other words, the second section 211.2 in the present embodiment is non-linear.

Third, the second section 211.2 is arranged to be isolated with the via hole 240. Specifically, the second section 211.2 and the via hole 240 are disjoint, that is, there is no connection between the second section 211.2 and the via hole 240. Besides, the projection of the second section 211.2 does not overlap projections of other U-shaped Ploy Sis 230 (excluding the U-shaped Ploy Si 230 corresponding to the data line segment 211 to which the second section 211.2 belongs) in a same plane (for example, the plane in which each data line 210 is located, the plane in which the U-shaped Ploy Si 230 is located, or a plane that is parallel to the above mentioned two planes). Specifically, the second section 211.2 does not cover other U-shaped Ploy Sis 230 at all.

In the present embodiment, in order to simplify the manufacture process, the first section 211.1 is preferably configured to have a linear shape. It is to be noted that in other embodiments, the first section 211.1 can also be a curve. For example, when the array substrate is a flexible array substrate, the first section 211.1 can be preferably configured to have a curved shape. This is because the above design can avoid breakage of the data line 210 when the flexible array substrate is pulled to bend. Thus, in the actual implementation process, those skilled in the art can set the shape of the first section 211.1 according to actual needs.

Further, for clearly illustrating the design principle of the array substrate and the beneficial effects achieved thereby in the present embodiment, a detailed description will be provided below in combination with FIGS. 3 and 4 on how to repair the array substrate in case of a data-data short between adjacent data lines 210 caused by Ploy Si 230 below the scanning line 220.

Figure 3:
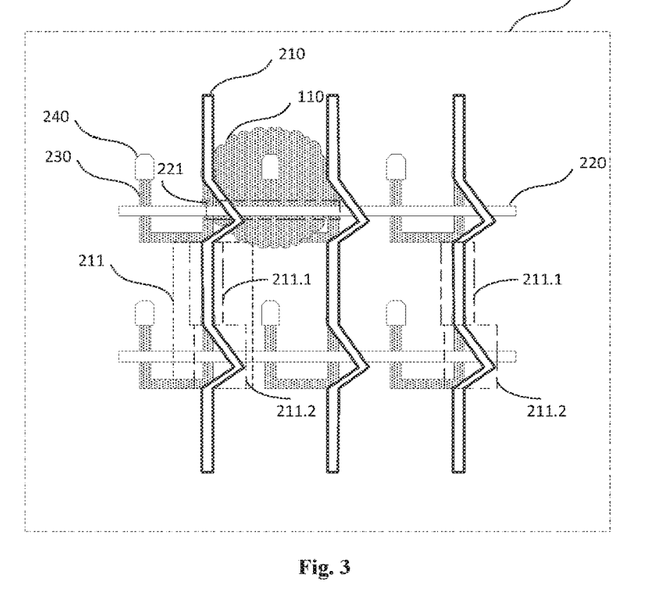
FIG. 3 schematically shows a partial structure of the first array substrate in which a data-data short between adjacent data lines is caused by residual Ploy Si in embodiments of the present disclosure.

Before a detailed description, the residual Ploy Si 110 in FIG. 3 is described first. The residual Ploy Si 110 is in one piece, and thus there is Ploy Si below a scanning line segment 221 of the scanning line 220 (the covered Poly Si is not shown in the visual angle of FIG. 3). Since the Ploy Si covered by the scanning line segment 221 cannot be removed in the prior art (other parts of the residual Ploy Si 110 can be removed by means of a laser device in the prior art), a data-data short between adjacent data lines 210 can be caused, as shown in FIG. 3.

Figure 4:
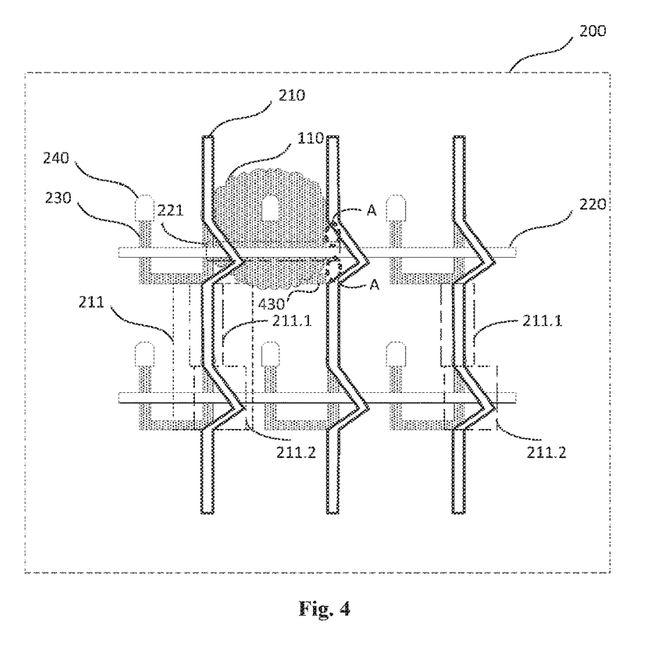
FIG. 4 schematically shows a partial structure of the repaired first array substrate in embodiments of the present disclosure.

With respect to the above problem, in the present embodiment, the second section 211.2 is configured to have the shape of a curve, and then the Ploy Si which connects first sections 211.1 of two adjacent data line segments 211 is removed using a laser device (reference can be made to regions A in FIG. 4, and a pixel with its pixel electrode connected to the U-shaped Ploy Si 430 is a dark spot on this occasion). After that, the Ploy Si which is not covered by the scanning line 220 (i.e., the part of the residual Ploy Si which is not covered by the scanning line 220) is cut off or completely removed by means of a laser device so as to eliminate the problem of the data-data short between adjacent data lines 210 and achieve the repairing of the array substrate. It is to be noted that configuring the second section 211.2 to be a curve has no influence on the electrical conductivity of the data line 210, on the normal display of other pixels (i.e., pixels excluding the pixel with the pixel electrode thereof connected to the U-shaped Ploy Si 430), or on the manufacture process.

To sum up, under the circumstance of the data-data short between adjacent data lines 210 caused by Ploy Si below the scanning line 220, if the array substrate provided in the present embodiment is used, the Ploy Si between the first sections 211.1 of two adjacent data line segments 211 can be removed, and the problem of the data-data short between adjacent data lines 210 can be eliminated, which can achieve the repairing of the array substrate, thereby reducing scrapping of array substrates and reducing production capacity loss.

Embodiment 2

In the present embodiment, the shape of the second section 211.2 in Embodiment 1 is further optimized.

In Embodiment 1, the second section 211.2 is in a shape of a curve. Based on this, the shape of the second section 211.2 is further defined in the present embodiment. Preferably, the second section 211.2 is in an axisymmetric shape, and an axis of symmetry is the scanning line 220 corresponding to the data line segment 211 to which the second section 211.2 belongs. Further, the axis of symmetry of the shape of the second section 211.2 is a central axis of the scanning line 220 corresponding to the data line segment 211 to which the second section 211.2 belongs.

Figure 5:
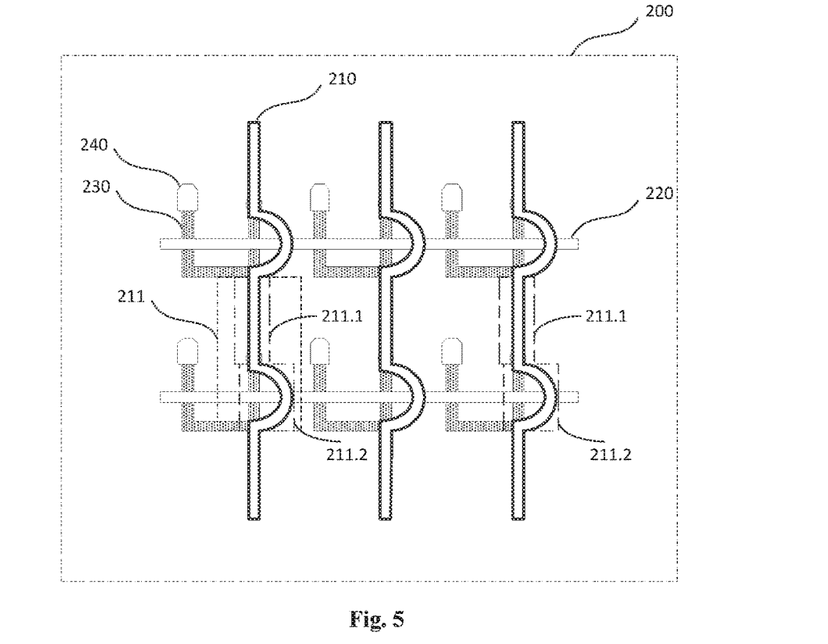
FIG. 5 schematically shows a partial structure of a second array substrate in embodiments of the present disclosure.
Figure 6:
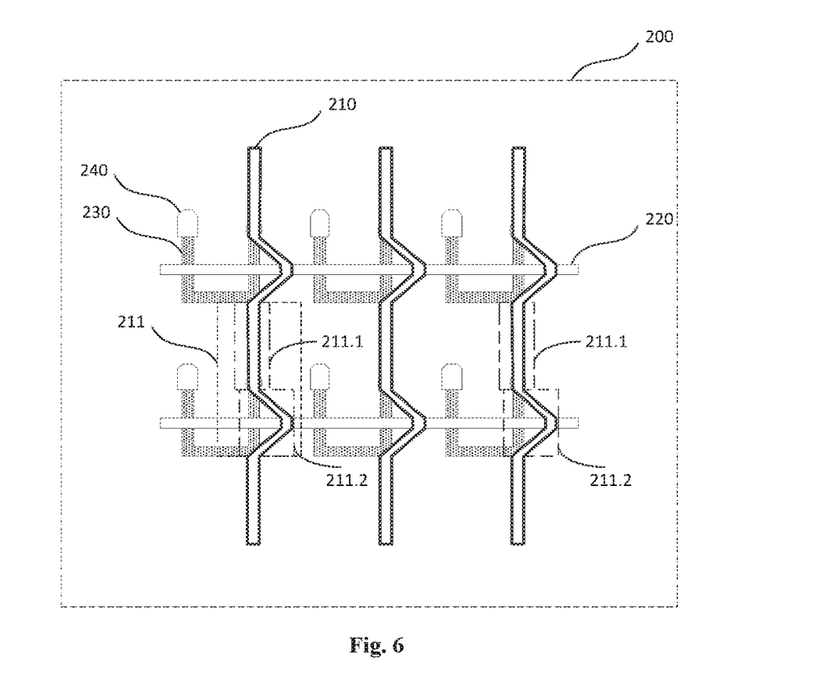
FIG. 6 schematically shows a partial structure of a third array substrate in embodiments of the present disclosure.
Figure 7:
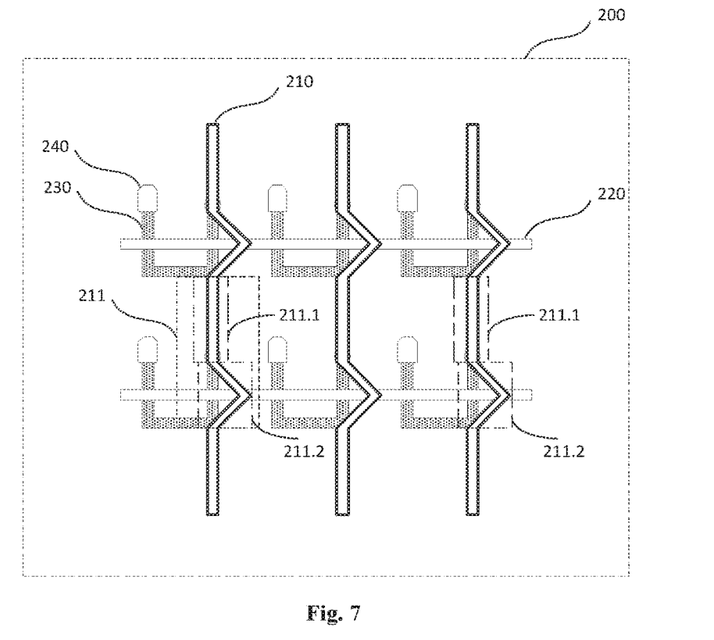
FIG. 7 schematically shows a partial structure of a fourth array substrate in embodiments of the present disclosure.

In the present embodiment, the second section 211.2 is preferably in a shape of an arc, a trapezoid, or a triangle. As shown in FIG. 5, the second section 211.2 is in a shape of an arc. As shown in FIG. 6, the second section 211.2 is in a shape of a trapezoid. As shown in FIG. 7, the second section 211.2 is in a shape of a triangle. In other embodiments, the second section 211.2 can be configured to be other axisymmetric shapes. The three preferable shapes in the present embodiment are only used to teach those skilled in the art how to specifically implement the present disclosure, and it does not mean that the second section 211.2 can only be configured to be the three shapes. During specific implementations, those skilled in the art can determine the shape of the second section 211.2 according to actual needs.

In addition, it is to be noted that the specific implementation manner of the present embodiment is similar to that of embodiment 1. For the specifics, please refer to the description of embodiment 1. Details will not be repeated for avoiding redundancy.

To sum up, under the circumstance of the data-data short between adjacent data lines 210 caused by Ploy Si below the scanning line 220, if the array substrate provided in the present embodiment is used, the Ploy Si between the first sections 211.1 of two adjacent data line segments 211 can be removed, and the problem of the data-data short between adjacent data lines 210 can be eliminated, which can achieve the repairing of the array substrate, thereby reducing scrapping of array substrates and reducing production capacity loss.

Embodiment 3

In the present embodiment, the shape of the second section 211.2 in Embodiment 1 is further optimized.

In Embodiment 1, the second section 211.2 is configured to have a shape of a curve. Based on this, the shape of the second section 211.2 is further defined in the present embodiment. Preferably, the second section 211.2 is configured to be a centrosymmetric shape, and a center of symmetry is an intersection of the data line segment 211 to which the second section 211.2 belongs and the scanning line 220 corresponding to the data line segment 211 to which the second section 211.2 belongs. Further, the center of symmetry of the shape of the second section 211.2 is the intersection of a central axis of the data line segment 211 to which the second section 211.2 belongs and a central axis of the scanning line 220 corresponding to the data line segment 211 to which the second section 211.2 belongs.

Figure 8:
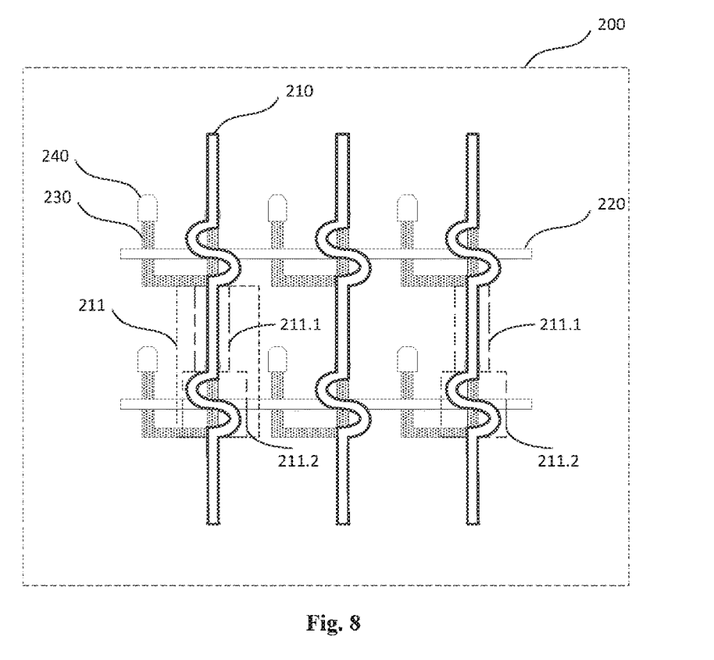
FIG. 8 schematically shows a partial structure of a fifth array substrate in embodiments of the present disclosure.

In the present embodiment, the second section 211.2 is preferably in an S-shape, as shown in FIG. 8. In other embodiments, the second section 211.2 can be configured to be other centrosymmetric shapes. The S-shape in the present embodiment is only used to teach those skilled in the art how to specifically implement the present disclosure, and it does not mean that the second section 211.2 can only be configured to be the S-shape. During specific implementations, those skilled in the art can determine the shape of the second section 211.2 according to actual needs.

In addition, it is to be noted that the specific implementation manner of the present embodiment is similar to that of embodiment 1. For the specifics, please refer to the description of embodiment 1. Details will not be repeated for avoiding redundancy.

To sum up, under the circumstance of the data-data short between adjacent data lines 210 caused by Ploy Si below the scanning line 220, if the array substrate provided in the present embodiment is used, the Ploy Si between the first sections 211.1 of two adjacent data line segments 211 can be removed, and the problem of the data-data short between adjacent data lines 210 can be eliminated, which can achieve the repairing of the array substrate, thereby reducing scrapping of array substrates and reducing production capacity loss.

Embodiment 4

The present disclosure further provides a liquid crystal display panel. The liquid crystal display panel in the present embodiment comprises the array substrate according to any of embodiment 1 to embodiment 3, a color filter substrate, and a liquid crystal layer arranged between the array substrate and the color filter substrate.

To sum up, under the circumstance of the data-data short between adjacent data lines 210 caused by Ploy Si below the scanning line 220, if the liquid crystal display panel provided in the present embodiment is used, the Ploy Si between the first sections 211.1 of two adjacent data line segments 211 can be removed, and the problem of the data-data short between adjacent data lines 210 can be eliminated, which can achieve the repairing of the array substrate, thereby reducing scrapping of array substrates and reducing production capacity loss.

Embodiment 5

The present disclosure further provides a liquid crystal display device. The liquid crystal display device in the present embodiment comprises the liquid crystal display panel according to embodiment 4. The liquid crystal display device is preferably a product having a display function, such as a cell phone, a tablet computer, a television, a navigator, etc.

To sum up, under the circumstance of the data-data short between adjacent data lines 210 caused by Ploy Si below the scanning line 220, if the liquid crystal display device provided in the present embodiment is used, the Ploy Si between the first sections 211.1 of two adjacent data line segments 211 can be removed, and the problem of the data-data short between adjacent data lines 210 can be eliminated, which can achieve the repairing of the array substrate, thereby reducing scrapping of array substrates and reducing production capacity loss.

Although the embodiments of the present disclosure are provided as above, the above embodiments are described only for better understanding, rather than restricting the present disclosure. Anyone skilled in the art can make amendments to the implementing forms or details without departing from the spirit and scope of the present disclosure. The scope of the present disclosure should be subject to the scope defined in the claims.

The invention claimed is:

1. An array substrate, which comprises:
a plurality of data lines, each of which is divided into multiple continuously connected data line segments,
a plurality of scanning lines, and
a plurality of pixel units, each of which includes a pixel switch,
wherein each data line segment corresponds to a pixel switch and a scanning line, and
wherein each data line segment is divided into a first section and a second section, the first section and the second section being connected to each other end to end, wherein the second section is located in a region of the pixel switch corresponding to the data line segment to which the second section belongs, and the second section has either
   (i) an axisymmetric shape, wherein an axis of symmetry of the shape of the second section includes the scanning line corresponding to the data line segment to which the second section belongs, or
   (ii) a centrosymmetric shape, wherein a center of symmetry of the shape of the second section includes an intersection of the data line segment to which the second section belongs and the scanning line corresponding to the data line segment to which the second section belongs.

2. The array substrate according to claim 1, wherein the first section is in a linear shape.

3. A liquid crystal display panel, which comprises an array substrate, a color filter substrate, and a liquid crystal layer arranged between the array substrate and the color filter substrate,
wherein, the array substrate comprises:
a plurality of data lines, each of which is divided into multiple continuously connected data line segments,
a plurality of scanning lines, and
a plurality of pixel units, each of which includes a pixel switch,
wherein each data line segment corresponds to a pixel switch and a scanning line,
wherein, each data line segment is divided into a first section and a second section, the first section and the second section being connected to each other end to end, wherein the second section is located in a region of the pixel switch corresponding to the data line segment to which the second section belongs, and the second section has either
   (i) an axisymmetric shape, wherein an axis of symmetry of the shape of the second section includes the scanning line corresponding to the data line segment to which the second section belongs, or
   (ii) a centrosymmetric shape, wherein a center of symmetry of the shape of the second section includes an intersection of the data line segment to which the second section belongs and the scanning line corresponding to the data line segment to which the second section belongs.

4. The liquid crystal display panel according to claim 3, wherein the first section is in a linear shape.

5. A liquid crystal display device, which includes a liquid crystal display panel comprising an array substrate, a color filter substrate, and a liquid crystal layer arranged between the array substrate and the color filter substrate,
wherein, the array substrate comprises:
a plurality of data lines, each of which is divided into multiple continuously connected data line segments,
a plurality of scanning lines, and
a plurality of pixel units, each of which includes a pixel switch,
wherein each data line segment corresponds to a pixel switch and a scanning line, and
wherein, each data line segment is divided into a first section and a second section, the first section and the second section being connected to each other end to end, wherein the second section is located in a region of the pixel switch corresponding to the data line segment to which the second section belongs, and the second section has either
   (i) an axisymmetric shape, wherein an axis of symmetry of the shape of the second section includes the scanning line corresponding to the data line segment to which the second section belongs, or
   (ii) a centrosymmetric shape, wherein a center of symmetry of the shape of the second section includes an intersection of the data line segment to which the second section belongs and the scanning line corresponding to the data line segment to which the second section belongs.

6. The liquid crystal display device according to claim 5, wherein the first section is in a linear shape.

* * * * *